(12) United States Patent  (10) Patent No.: US 12,284,920 B2
Guedes et al.  (45) Date of Patent: Apr. 22, 2025

(54) PIEZOELECTRIC MICROMACHINED ULTRASONIC TRANSDUCER WITH A PATTERNED MEMBRANE STRUCTURE

(71) Applicant: InvenSense, Inc., San Jose, CA (US)

(72) Inventors: Andre Guedes, Barcelona (ES); Fabian Goericke, Berkeley, CA (US); Stefon Shelton, Oakland, CA (US); Benedict Costello, Piedmont, CA (US); David Horsley, Albany, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 18/381,104

(22) Filed: Oct. 17, 2023

(65) Prior Publication Data

US 2024/0049602 A1  Feb. 8, 2024

Related U.S. Application Data

(63) Continuation of application No. 16/802,436, filed on Feb. 26, 2020, now Pat. No. 11,844,282, which is a
(Continued)

(51) Int. Cl.
*H10N 30/50* (2023.01)
*H04R 17/00* (2006.01)
(Continued)

(52) U.S. Cl.
CPC .............. *H10N 30/50* (2023.02); *H04R 17/00* (2013.01); *H10N 30/057* (2023.02); *H10N 30/871* (2023.02); *H10N 30/883* (2023.02)

(58) Field of Classification Search
CPC .............. H01L 41/083; H01L 41/0471; H01L 41/0533; H01L 41/277; H01L 41/318;
(Continued)

(56) References Cited

U.S. PATENT DOCUMENTS 2,910,545 A  10/1959  Glenn
6,249,075 B1  6/2001  Bishop et al.
(Continued)

FOREIGN PATENT DOCUMENTS

DE  10 2013 114 826 A1  6/2015
WO  WO 2012/145278 A2  10/2012
(Continued)

OTHER PUBLICATIONS

International Search Report and Written Opinion in International Application No. PCT/US2017/062059, mailed Feb. 16, 2018.
(Continued)

*Primary Examiner* — Ermias T Woldegeorgis
(74) *Attorney, Agent, or Firm* — DLA Piper LLP (US)

(57) ABSTRACT

A piezoelectric micromachined ultrasonic transducer (PMUT) device includes a substrate having an opening therethrough and a membrane attached to the substrate over the opening. An actuating structure layer on a surface of the membrane includes a piezoelectric layer sandwiched between the membrane and an upper electrode layer. The actuating structure layer is patterned to selectively remove portions of the actuating structure from portions of the membrane to form in a central portion proximate a center of the open cavity and three or more rib portions projecting radially outward from the central portion.

18 Claims, 5 Drawing Sheets

Related U.S. Application Data continuation of application No. PCT/US2017/062059, filed on Nov. 16, 2017.

(51) Int. Cl.
*H10N 30/057* (2023.01)
*H10N 30/87* (2023.01)
*H10N 30/88* (2023.01)

(58) Field of Classification Search
CPC ... H01L 41/332; H01L 41/0973; H04R 17/00; B06B 1/0607; H10N 30/50; H10N 30/078; H10N 30/871; H10N 30/082; H10N 30/883; H10N 30/2047; H10N 30/057
See application file for complete search history.

(56) References Cited

U.S. PATENT DOCUMENTS

| | | | |
|---|---|---|---|
| 11,844,282 | B2 | 12/2023 | Guedes et al. |
| 2001/0035700 | A1 | 11/2001 | Percin et al. |
| 2006/0018672 | A1 | 1/2006 | Asaba |
| 2006/0186762 | A1 | 8/2006 | Sugiura et al. |
| 2007/0195976 | A1 | 8/2007 | Sekino et al. |
| 2009/0185700 | A1 | 7/2009 | Suzuki |
| 2010/0327695 | A1 | 12/2010 | Goel et al. |
| 2010/0327702 | A1* | 12/2010 | Martin .................. G01K 7/32 29/25.35 |
| 2012/0074509 | A1 | 3/2012 | Berg et al. |
| 2012/0250909 | A1 | 10/2012 | Grosh et al. |
| 2016/0315247 | A1* | 10/2016 | Boser .................. H10N 30/853 |
| 2017/0021391 | A1* | 1/2017 | Guedes ................ B06B 1/0603 |
| 2017/0194934 | A1 | 7/2017 | Shelton et al. |
| 2017/0246662 | A1 | 8/2017 | Kidwell, Jr. et al. |
| 2020/0338592 | A1 | 10/2020 | Goericke et al. |

FOREIGN PATENT DOCUMENTS

| | | | | |
|---|---|---|---|---|
| WO | WO 2012/145278 | A3 | 10/2012 | |
| WO | WO 2014/134723 | A1 | 9/2014 | |
| WO | WO 2015/131083 | A1 | 9/2015 | |
| WO | WO-2016106153 | A1 * | 6/2016 | ........... B06B 1/0651 |

OTHER PUBLICATIONS

Extended European Search Report in European Application No. 17931996.7, dated Mar. 9, 2021.

Guedes, A. et al., "Aluminum Nitride pMUT Based on a Flexurally-Suspended Membrane", 2011 16th International Solid-State Sensors, Actuators and Microsystems Conference, pp. 2062-2065, Jun. 2011.

Muralt, P. et al., "Study of PZT Coated Membrane Structures for Micromachined Ultrasonic Transducers", 2001 IEEE Ultrasonics Symposium Proceedings, An International Symposium, vol. 2, pp. 907-911, Oct. 2001.

Shelton, S. et al., "CMOS-Compatible AlN Piezoelectric Micromachined Ultrasonic Transducers", 2009 IEEE International Ultrasonics Symposium, pp. 402-405, Sep. 2009.

* cited by examiner

PIEZOELECTRIC MICROMACHINED ULTRASONIC TRANSDUCER WITH A PATTERNED MEMBRANE STRUCTURE

CLAIM OF PRIORITY

This application is a continuation of U.S. application Ser. No. 16/802,436 filed Feb. 26, 2020, which is a continuation of International Patent Application number PCT/US2017/062059 filed Nov. 16, 2017, the entire contents of which are incorporated herein by reference.

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

FIELD OF THE DISCLOSURE

The present disclosure generally relates to micromachined ultrasonic transducers (MUTs) and more particularly to a design for a piezoelectric micromachined ultrasonic transducer (PMUT) device and a method to fabricate such a device.

BACKGROUND OF THE DISCLOSURE

Micromachined ultrasonic transducers (MUTs) have been subject to extensive research for the last two decades. Piezoelectric micromachined ultrasonic transducers (pMUTs) are MUTs that use a piezoelectric layer for electromechanical transduction. A typical pMUT is a multilayer membrane structure that is excited into flexural vibration using piezoelectric actuation. The membrane structure is often formed by etching through a silicon wafer to remove the material beneath the membrane, thereby allowing it to vibrate. This etch forms a hollow tube beneath the backside of the membrane. Sound is emitted from the tube when the membrane vibrates, and the tube may be designed as an acoustic resonator to improve acoustic performance of the pMUT. These devices typically operate at the membrane's flexural resonance frequency, which is defined by selecting the correct materials, membrane size, thickness and/or in-plane stress. For multi-pMUT applications, good matching of the resonance frequencies of the individual pMUTs is required for proper operation. For this reason, it is important for pMUTs to be manufactured with closely-matched resonance frequencies. One important parameter causing frequency variation is the residual stress present in the layers composing the pMUT membrane, in particular in the piezoelectric layer. A typical pMUT structure consists of a membrane that is attached to the substrate at its boundary, a condition that is described as a clamped boundary condition. The resonant frequency of a membrane with a clamped boundary condition is very sensitive to in-plane residual stress. Several designs have been suggested to reduce stress sensitivity, such as released cantilevers and flexurally-suspended membranes, but they all show poor acoustic performance and or poor manufacturability (e.g., inefficient resonance modes, cracks created by stress concentrations, poor micro-fabrication yield).

In US 2012/0250909 Grosh describes an acoustic transducer wherein a membrane transducer is released from the substrate by separating the membrane into several identical tapered cantilevers, reducing the effect of stress on the mechanical behavior of the membrane. Grosh's approach works well for a non-resonant device, such as a conventional piezoelectric microphone. However, for a pMUT operated at resonance, small differences caused by fabrication variations can cause the cantilevers to have slightly different resonance frequencies, resulting in considerable negative impact on the acoustic performance of the device when operated at resonance. Specifically, when excited at a single frequency, mismatched cantilevers will oscillate with significantly different phase and amplitude, creating phase and amplitude errors in the ultrasound signal.

International Patent Application Publication Number WO 2015/131083 describes patterning the actuation structure of a pMUT with an electrode proximate the membrane edge with ribs radiating inward. Such patterning (sometimes referred to as a "ring" electrode) can reduce residual stress in the membrane. In some sense, however, an actuating structure with a "central" electrode has much better performance than the "ring" electrode. In particular, the electromechanical coupling is higher for the central electrode structure than for the ring electrode structure. Unfortunately pMUTs with a central electrode generally have more frequency variation because they have piezo material over the entire surface, and the piezo material's stress varies significantly across the wafer.

Accordingly, what is needed is a pMUT design with good acoustic performance that resonates at a single stable resonance mode and with low sensitivity to stress.

SUMMARY

According to aspects of this disclosure a piezoelectric micromachined ultrasonic transducer (PMUT) device may include a substrate having an open cavity, a membrane attached to the substrate, and an actuating structure on a surface of the membrane. The actuating structure layer includes a piezoelectric layer sandwiched between the membrane and an upper electrode layer. The actuating structure is patterned so that portions of the actuating structure are selectively removed from portions of the membrane to form an actuating structure having a central portion proximate a center of the open cavity and three or more rib portions projecting radially outward from the central portion.

In some implementations the membrane may be attached to the substrate at one or more anchor portions of the membrane proximate the perimeter of the open cavity. In some such implementations the ribs may extend from the central portion to, or beyond, the anchor points of the membrane.

In some implementations, there may be four or more ribs, six or more ribs, or eight or more ribs.

In some implementations, one or more of the three or more ribs may be patterned such that it is mechanically coupled to the central portion but electrically isolated from the central portion.

In some implementations, the actuating structure may be encapsulated by a passivation layer. In some such implementations the passivation layer may be patterned such that it is substantially removed from the portions of the membrane not covered by the actuating structure layers.

In some implementations, the ribs may include one or more tapered rib portions. Such tapered rib portions may be wider proximate the perimeter of the membrane than at the central portion.

In some implementations, the membrane layer may be perforated with one or more holes that pass through the actuating structure and the membrane layer.

In some implementations the actuating structure layer may include a lower electrode layer sandwiched between the piezoelectric layer and the membrane.

In some implementations the perimeter of the open cavity may be circular in shape.

In some implementations the perimeter of the open cavity may be square in shape.

In some implementations the perimeter of the open cavity may be polygonal in shape.

In some implementations the three or more rib portions may include four or more rib portions.

In some implementations the three or more rib portions may include six or more rib portions.

In some implementations the three or more rib portions may include eight or more rib portions.

In some implementations the three or more rib portions may include one or more tapered rib portions.

In some implementations the three or more rib portions may include one or more tapered rib portions that are wider proximate the peripheral portion than at the central portion.

Some implementations of pMUT devices in accordance with aspects of the present disclosure may further include a passivation layer formed over the actuating structure.

Some implementations of pMUT devices in accordance with aspects of the present disclosure may further include an opening formed through the central portion of the actuating structure and through an underlying portion of the membrane to the open cavity.

In some implementations a ratio of a radius of the central portion of the actuating structure to a radius of the membrane layer may be between 0.4 and 0.8.

In some implementations a ratio of a radius of the central portion to a radius of the membrane layer may be about 0.6.

Aspects of the present disclosure include a method for fabricating a piezoelectric micromachined ultrasonic transducer (PMUT) device. The method generally involves forming a membrane attached to a substrate; forming an actuating structure on a surface of the membrane, the actuating structure layer including a piezoelectric layer sandwiched between the membrane and an upper electrode layer; patterning the actuating structure to selectively remove portions of the actuating structure from portions of the membrane to form an actuating structure having a central portion proximate a center of the membrane and three or more rib portions projecting radially outward from the central portion; and forming an opening through a portion of the substrate underlying the membrane and actuating structure.

BRIEF DESCRIPTION OF THE FIGURES

The present disclosure may be better understood by reference to the following drawings which are for illustrative purposes only.

DETAILED DESCRIPTION

Although the description herein contains many details, these should not be construed as limiting the scope of the invention but as merely providing illustrations of some of the presently preferred embodiments of this invention. Therefore, it will be appreciated that the scope of the present invention fully encompasses other embodiments, which may become obvious to those skilled in the art.

Introduction

To overcome issues of residual stress present in the piezoelectric layer that affects the stiffness of the membrane of a pMUT device, aspects of the present disclosure include a patterned actuating structure having selected portions removed from portions of an underlying membrane leaving an actuating structure with a central portion proximate a center of the membrane and three or more rib portions projecting radially. Such patterning provides the advantages of having a central electrode while reducing residual stress and associated frequency variation.

Piezoelectric Micromachined Ultrasonic Transducer (PMUT) Device

Figure 1:
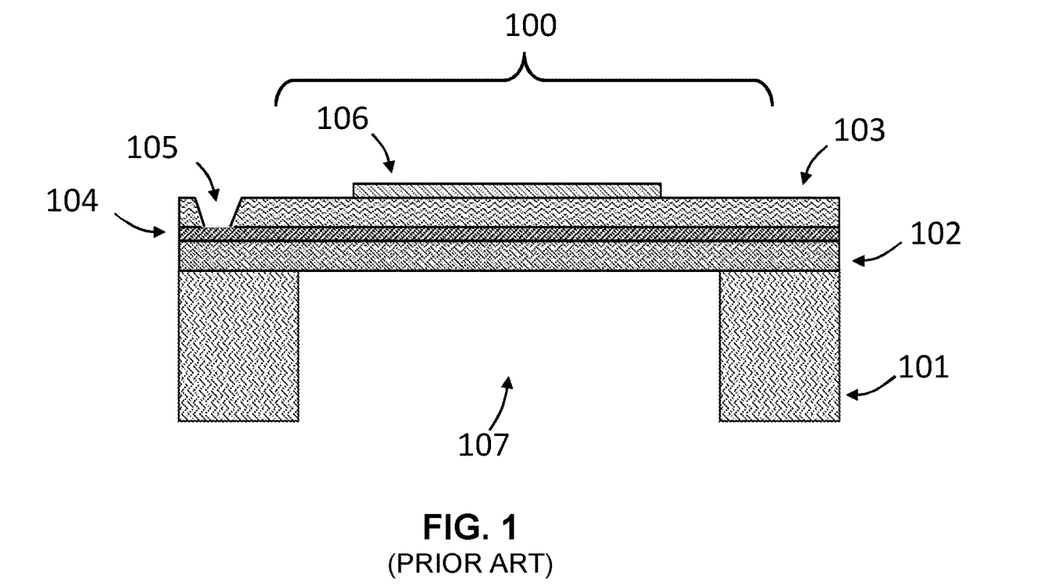
FIG. 1 shows a cross section of a circular clamped transducer design known from prior art.

A piezoelectric micromachined ultrasonic transducer (PMUT) device within the context of the present disclosure may be more fully appreciated by comparison to existing pMUT designs. By way of example, FIG. 1 depicts a typical conventional art pMUT device 100 formed from multiple thin-film layers deposited onto the substrate 101. The device is formed on a substrate 101, e.g., made of silicon but alternative materials such as glass or polymer substrates may be used. A bottom layer 102 is formed on a surface of the substrate. A bottom electrode layer 104 is sandwiched between the bottom layer 102, and a piezoelectric layer 103. A top electrode 106 is formed on the piezoelectric layer 103. An opening 107 is formed through the substrate 101 from a backside thereof all the way through to the underside of the bottom layer 102.

The bottom layer 102 may be made of silicon, silicon dioxide, and/or silicon nitride, among other materials. The piezoelectric layer 103 may be composed of various piezoelectric materials including AlN and alloys of AlN such as $Sc_xAl_{1-x}N$, PZT (lead zirconate titanate) and alloys of PZT such as PLZT and PNZT, ZnO, KNN ($K_xNa_{1-x}NbO_3$) or PMN-PT (lead magnesium niobate-lead titanate). Polymer piezoelectric materials such as PVDF may be sometimes be used as piezoelectric layer 103. Various metals may be used for bottom electrode 104 and top electrode 106 including Al, Au, Pt, Cu, and Mo. Where the bottom layer 102 is made of a sufficiently electrically conductive material, such as doped silicon, the bottom electrode layer 104 may be omitted.

One of the problems with a pMUT design like that shown in FIG. 1 is that residual stress can be present in the piezoelectric layer that affects the stiffness of the membrane. In general, the membrane's stiffness is determined by both the residual stress (e.g., tension or compression) and the membrane's flexural rigidity. The flexural rigidity is determined by parameters that can be tightly controlled during the manufacturing process, namely the membrane geometry (e.g., thickness and diameter) and material properties (e.g., Young's modulus and Poission's ratio). However, residual stress, particularly in the piezoelectric layer and electrode layers, is more difficult to control and variations in this residual stress from device-to-device and wafer-to-wafer can detrimentally affect the resonant frequency and overall acoustic performance of the pMUT device 100, leading to undesirable manufacturing variations in the pMUT devices. To overcome these problems, aspects of this disclosure include a micromachined ultrasonic transducer (MUT), in particular a piezoelectric micromachined ultrasonic transducer (pMUT) having a variable thickness structure that includes portions of the piezoelectric layer and electrode layer(s). Portions of the piezo stack (i.e., the structure containing the piezoelectric layer and electrode(s)) are removed from the membrane, forming rib-like structures. These rib-like structures substantially maintain the flexural rigidity of the membrane, but substantially reduce the contribution of the piezo stack's residual stress on the membrane stiffness.

Variable Thickness Structure

Figure 2:
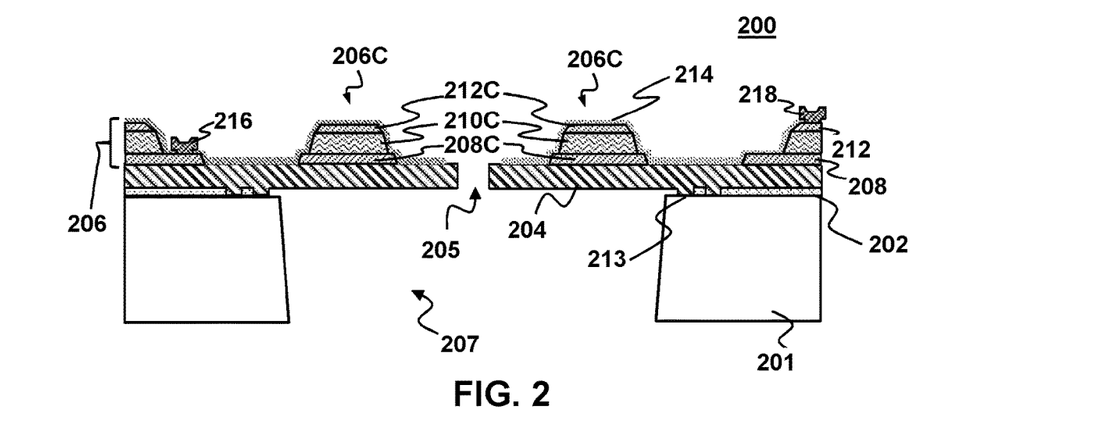
FIG. 2 is a cross section of a pMUT taken along line 2-2 of FIG. 3 according to aspects of the present disclosure.
Figure 3:
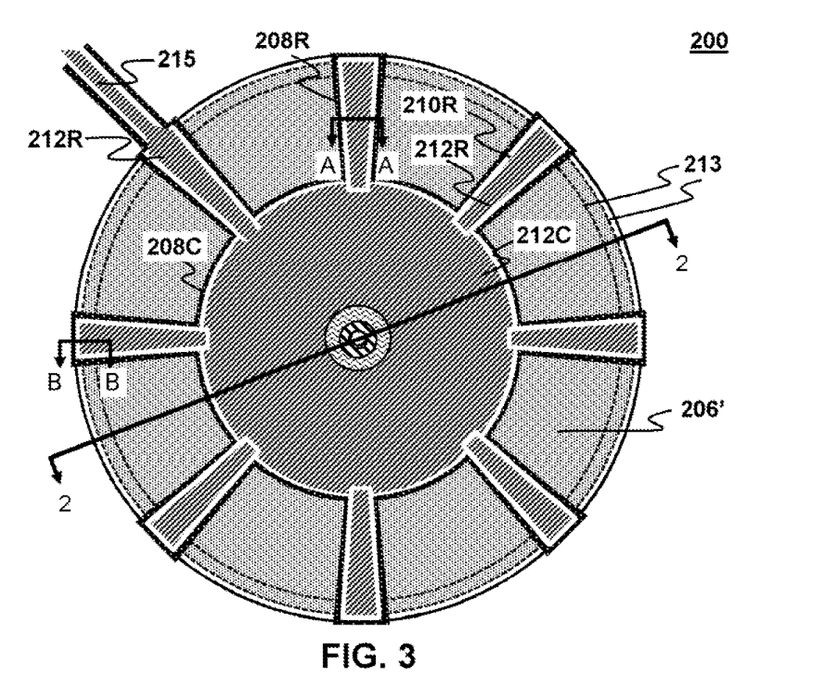
FIG. 3 is a top view of a partially fabricated pMUT according to aspects of the present disclosure.
Figure 4A:
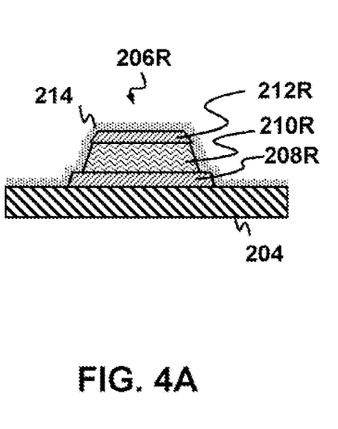
FIG. 4A is a cross section of a rib portion of an actuating structure for the pMUT shown in FIG. 2 and FIG. 3 taken along line A-A of FIG. 3.
Figure 4B:
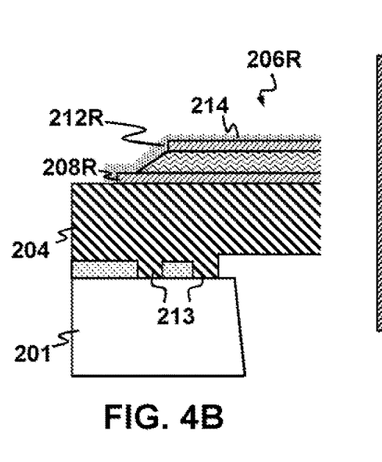
FIG. 4B is a cross section of a rib portion of an actuating structure for the pMUT shown in FIG. 2 and FIG. 3 taken along line B-B of FIG. 3.

FIG. 2 and FIGS. 4A-4B are cross-section illustrations of portions of a pMUT device 200 in accordance with aspects of the present disclosure. FIG. 3 is a corresponding plan view of the device. The device 200 may be formed from multiple thin-film layers deposited onto a substrate 201. The substrate 201 may be silicon but alternative materials such as glass or polymer substrates may be used. An opening 207 may be formed though the substrate 201. In the illustrated pMUT device 200, a sacrificial layer 202 is formed on a surface of the substrate 201. Sacrificial layer 202 may be made of various materials such as silicon dioxide, and the thickness of this layer is in the range of 0.1 microns to 4 microns.

An elastic layer 204 is formed on the sacrificial layer 202 and over the opening 207 in the substrate 201. The elastic layer 204 may be made of silicon, silicon dioxide, and/or silicon nitride, among other materials. By way of example, and not by way of limitation, the elastic layer 204 may be made of polycrystalline silicon (polysilicon). The elastic layer 204 may be anchored directly to the substrate 201 at one or more anchors 213 formed through openings in the sacrificial layer 202. A thickness of the elastic layer 204 may range from, e.g., about 1 microns to about 20 microns for transducers with center frequency from 40 kHz to 30 MHz, and more specifically from 1 micron to 20 microns for transducers with center frequency from 40 kHz to 1 MHz. A small vent opening 205 may be formed through the membrane layer to facilitate equalization of pressure between the two sides of the membrane layer. The vent opening 205 is generally relatively small compared to the size of the opening 207. By way of example, and not by way of limitation, the diameter of the opening 205 may be between 2 microns to 50 microns. It is generally desirable to locate the vent opening in some place where there is not much stress in the membrane 204, which may not necessarily be true at the center. Examples of such vent openings are described, e.g., in U.S. patent application Ser. No. 15/141,746 filed Apr. 28, 2016 (published as Patent Application Publication Number 20170021391), U.S. patent application Ser. No. 15/625,421 filed Jun. 16, 2017, and International Patent Application Number PCT/US17/36613 filed Jun. 8, 2017, the entire contents of all of which are incorporated herein by reference.

An actuating structure layer 206 is formed on a surface of the membrane layer 204. In the illustrated example, the actuating structure layer 206 includes a lower electrode layer 208 sandwiched between the elastic layer 204 and a piezoelectric layer 210, which is sandwiched between the lower electrode layer 208 and an upper electrode layer 212. The bottom and top electrode layers may be made of various metals such as Mo, Pt, or Al, and the thickness of these layers may range from 50 nm to 500 nm and more specifically from 100 nm to 300 nm. The piezoelectric layer 210 is formed over the bottom electrode 208. The bottom electrode layer 208 may also extend beyond the piezoelectric layer 210 and cover portions of the elastic layer 204. The piezoelectric layer 210 may be made of various piezoelectric materials including aluminum nitride (AlN) and its alloys such as ScAlN, lead zirconate titanate (PZT) and its alloys such as PLZT and PNZT, zinc oxide (ZnO), $K_xNa_{1-x}NbO_3$ (KNN) or lead magnesium niobate-lead titanate (PMN-PT). Polymer piezoelectric materials such as PVDF may be used as piezoelectric layer 210 as well. The thickness of piezoelectric layer 210 may range from about 250 nm to about 3000 nm, more specifically from about 500 nm to about 1500 nm. In the region spanning between the anchors 213 where the elastic layer 204 is released from the substrate 201, the combination of the elastic layer 204 and the actuating structure 206 forms a flexing part of the device 200. For convenience, this flexing combination is referred to herein as the membrane.

The actuating structure layer 206 is patterned to form an actuating structure having a central portion 206C proximate a center of the membrane, rib portions 206R projecting radially and extending to the edge or beyond the edge of the membrane, and open portions 206' that are free of the piezoelectric layer 210 and electrode layers 208, 212. Each of the open portions borders the central portion and at least two of the rib portions. In some implementations a ratio of a diameter of central portion 206C to a diameter of the membrane may be between 0.4 and 0.8, e.g., about 0.6. In some implementations the rib portions 206R may include one or more tapered rib portions. By way of example, and not by way of limitation, such tapered rib portions may be wider proximate the edge of the membrane than at the central portion 206C.

In some implementations a protective passivation layer 214 may be formed over the actuating structure 206 to encapsulate and protect the lower electrode 208, upper electrode 212, and piezoelectric layer 210 from corrosion e.g., due to humidity. In some embodiments this passivation layer may extend over otherwise exposed portions of the membrane 204 in the open portions 206'. Electrical connections to the electrodes may be made through contacts 216, 218, respectively, formed in openings in the passivation layer 214.

Figure 4C:
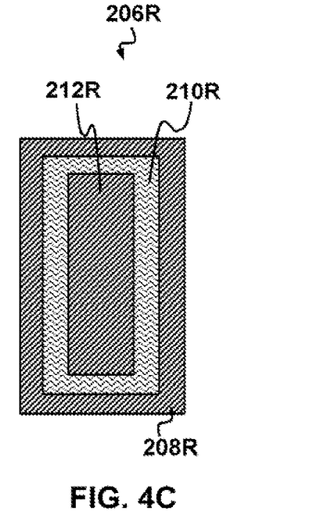
FIG. 4C is a top plan view of a rib portion of an actuating structure for a pMUT according to aspects of the present disclosure.

FIGS. 4A-4B show the cross-sectional structure of one of the rib portions 206R depicted in FIG. 3. To facilitate understanding, the passivation layer 214 is not shown in FIG. 3. A top view of a rib portion 206R is shown in FIG. 4C.

As described earlier, the membrane's stiffness has two components, the first being the flexural rigidity of the membrane layers (e.g., the elastic layer 204 and the actuating layers 206) and the second being the tensile or compressive stress in these layers. The presence of the rib portions 206R keeps the flexural rigidity of the membrane comparable to a continuous, unpatterned membrane. However, the absence of the actuating structure 206 (piezoelectric layer 210, top electrode 212 and bottom electrode 208) in the open portions of the membrane reduces the contribution of the stress in these layers to the stiffness of the membrane.

FIG. 3 illustrates and example of a partially fabricated pMUT device 200 showing the patterned lower electrode layer 208 formed on the membrane layer 204. This example illustrates the device 200 at an intermediate stage of fabrication after the upper electrode 212 has been formed and patterned on the piezoelectric layer 210, after which the piezoelectric layer 210 has been patterned and finally the exposed bottom electrode layer 208 has been patterned, and the resulting actuating structure 206 has been fully encapsulated by the passivation layer 214. The electrode layers 208, 212 and piezoelectric layer 210 may be patterned to define central portions 208C, 212C proximate a center of the membrane, and rib portions 208R, 210R, 212R projecting radially outward from the center portion 208C, 212C and extending to or beyond the anchors 213 that support the membrane edges, e.g., as seen in FIG. 4B. At least one rib portion is electrically connected to the center portion and to a contact 215 while the other rib portions may be electrically isolated from the center portion since these rib portions do not contribute the actuation or sensing of vibration in the membrane. Lower electrode portions 208C, 208R are denoted by dashed lines in FIG. 3. In the example depicted in FIG. 3 there are eight (8) open portions 206' where the membrane 204 is not covered by the electrode layers. However, aspects of the present disclosure are not limited to such implementations and generally encompass implementations in which there are more than three open portions, e.g., four or more, six or more, eight or more. In the illustrated example, the membrane 204 is covered by the passivation layer 214 in the open portions. However, aspects of the present disclosure are not limited to such implementations and include implementations in which there is no passivation layer over the membrane in the open portions.

Figure 5A:
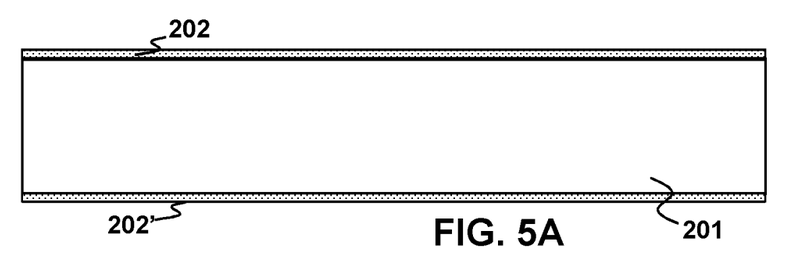
FIGS. 5A-5K are a sequence of cross-sectional schematic diagrams illustrating fabrication of a pMUT device in accordance with aspects of the present disclosure.
Figure 5B:
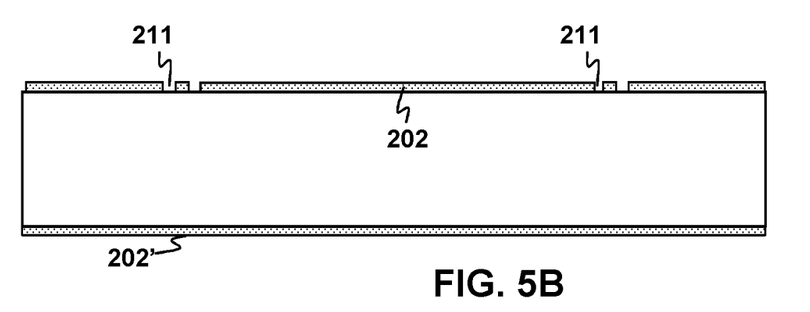

A pMUT device of the type depicted in FIGS. 2-4C may be fabricated in accordance with aspects of the present disclosure, e.g., as illustrated in FIGS. 5A-5L. Specifically, as shown in FIG. 5A, fabrication may start with a substrate 201 having the sacrificial layer 202 formed thereon. The sacrificial layer may be formed by any suitable deposition or growth technique for the relevant material. Deposition techniques include physical vapor deposition (PVD) and chemical vapor deposition (CVD). Growth techniques include thermal oxidation (e.g., where the sacrificial layer is an oxide of the substrate material). Next, the sacrificial layer 202 may be patterned to define anchor point openings 211, as shown in FIG. 5B. Such patterning may be accomplished with a conventional lithography followed by a suitable etch to form openings through the passivation layer 202 to the surface of the substrate 201.

Figure 5C:
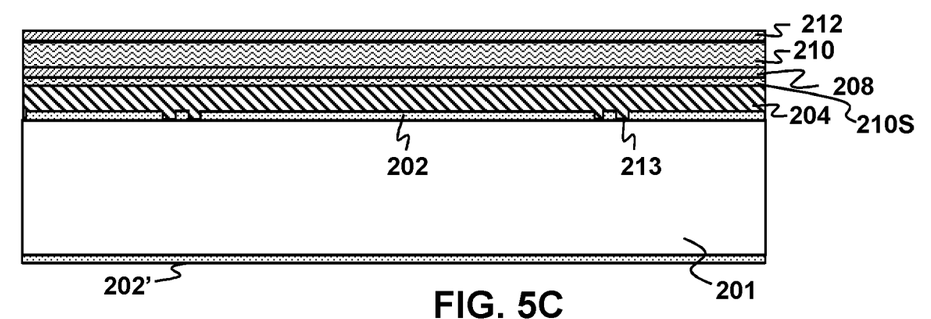

Next, as shown in FIG. 5C, the elastic layer 204 may be formed over the sacrificial layer 202, e.g., in a CVD or epitaxial reactor. The presence of the anchor point openings 211 facilitates attachment of the membrane layer 204 to the substrate 201 by anchors 213. The elastic layer 204 is then polished, e.g., using chem-mechanical polishing (CMP), to achieve a low surface roughness in preparation for deposition of the piezoelectric actuation structure. The lower electrode layer 208 is then formed, e.g., by a metal deposition technique such as PVD. In some implementations a seed layer 208S, e.g., of AlN, may be formed on the elastic layer 204 and the metal of the lower electrode layer 208 may be formed on the seed layer. The piezoelectric layer 210 is formed on top of the lower electric layer 208 using a deposition technique such as PVD or chemical solution deposition, also known as sol-gel deposition. The upper electrode layer 212 is then formed over the piezoelectric layer 210, e.g., by a metal deposition technique such as PVD, and is then patterned to form a central area 212C and rib portions 212R.

Figure 5D:
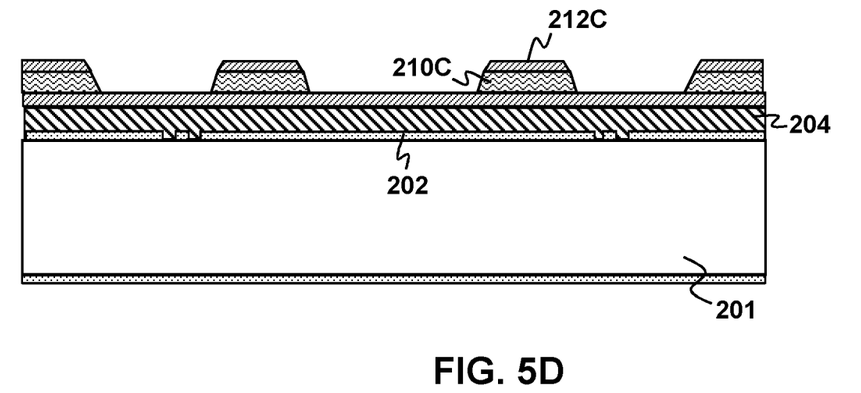
Figure 5E:
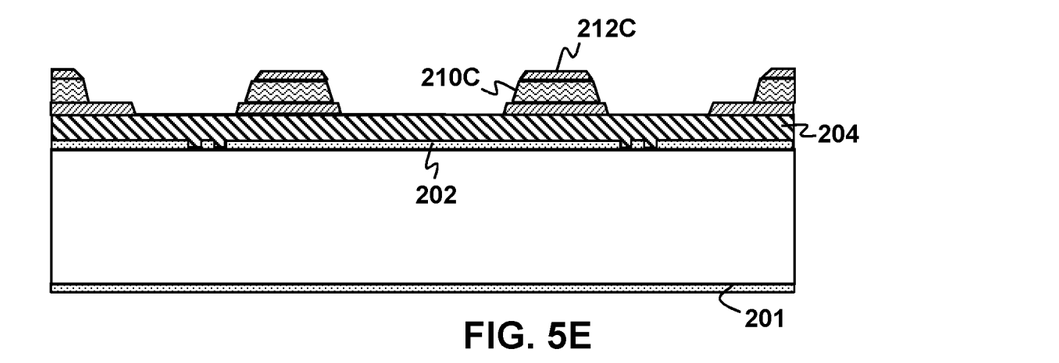
Figure 5F:
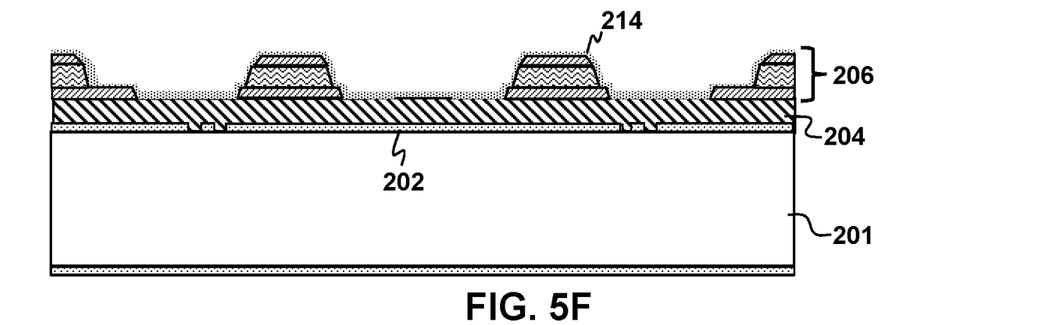
Figure 5G:
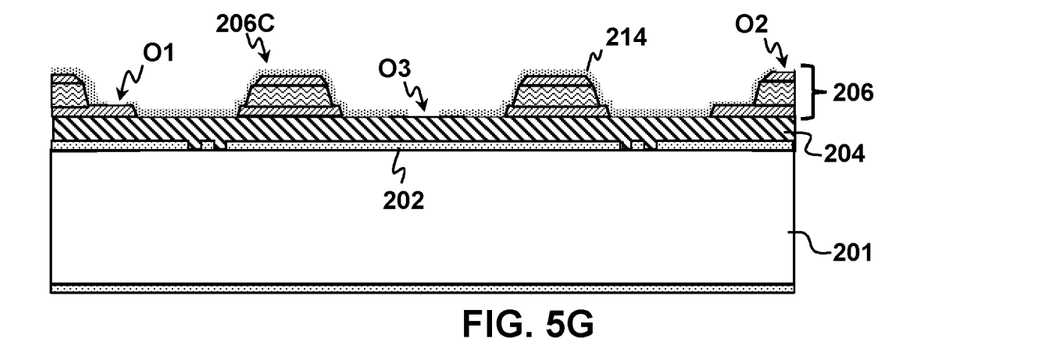

The piezoelectric layer 210 is then patterned as shown in FIG. 5D, e.g., using an etching process that stops on the lower electrode layer 208. The lower electrode layer 208 is then patterned as shown in FIG. 5E thereby defining the central portion 208C. Following patterning of the lower electrode layer, the passivation layer 214 is deposited, encapsulating the upper electrode layer 212, the piezoelectric layer 210, and the lower electrode layer 208 as shown in FIG. 5E. By way of example, and not by way of limitation, the passivation material 214 may be aluminum nitride (AlN), silicon nitride ($Si_3N_4$), silicon carbide (SiC) or another dielectric material. Alternatively, different materials may be used. In some embodiments, the passivation layer 214 may be subsequently removed from the open portions of the elastic layer 204 not covered by the upper electrode layer 212, the piezoelectric layer 210, and the lower electrode layer 208. As shown in FIG. 5G, Openings O1, O2 may be formed through the passivation layer 214 to allow for electrical contacts to the upper electrode 212 and lower electrode 208. An additional opening O3 may be formed though the passivation layer to define a vent opening.

Figure 5H:
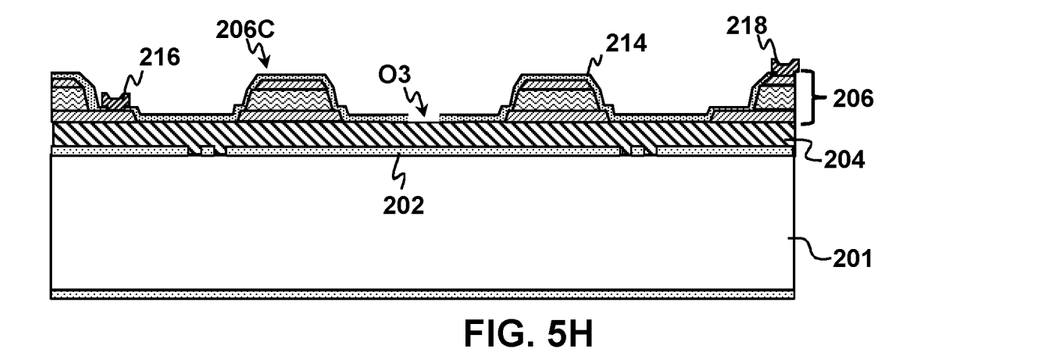

Conductive contacts 216, 218 may be formed to the lower electrode 208 and upper electrode 212, as shown in FIG. 5H. The contacts 216, 218 may be made of a corrosion-resistant material such as gold. A vent opening 205 may formed through the membrane layer 204 and any overlying layer, such as the piezoelectric layer 210.

Figure 5I:
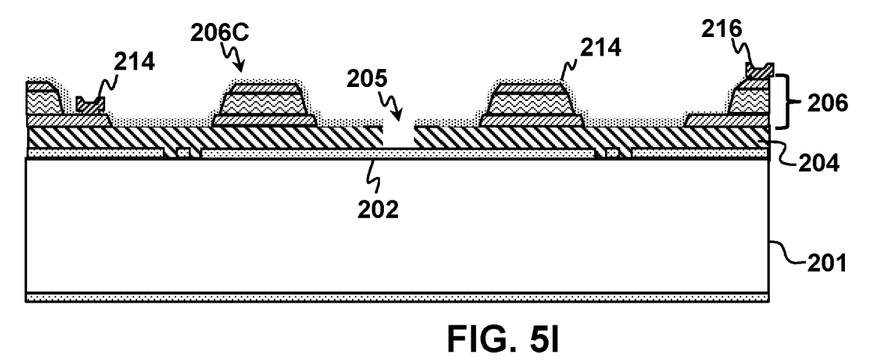
Figure 5J:
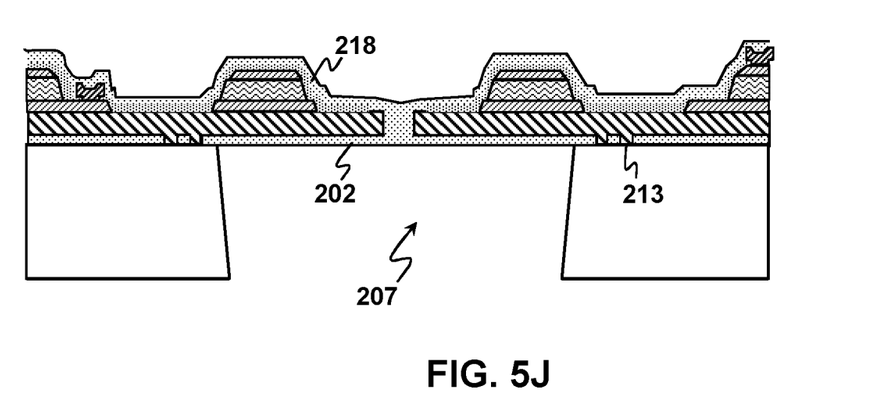
Figure 5K:
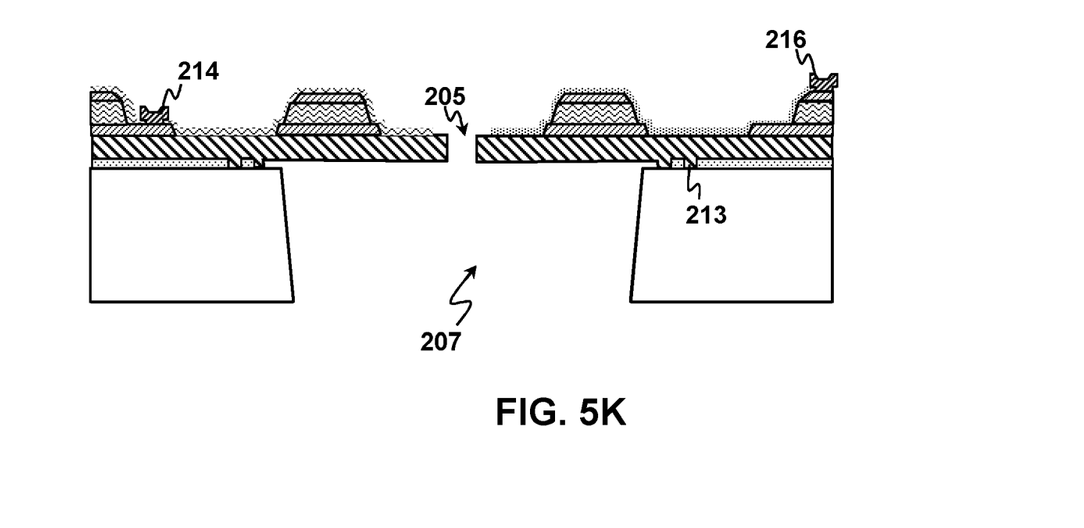

The device may then be finished as shown in FIGS. 5I-5K. Specifically, a vent opening may be formed through the elastic layer 204 to the sacrificial layer 202, as shown in FIG. 5I. Then a protective layer 218, e.g., an oxide may be formed over the front side of the device and the opening 207 may be formed through the substrate, e.g., by etching the substrate from the backside, stopping on the sacrificial layer 202, as shown in FIG. 5J. Any suitable isotropic or anisotropic etch process for the substrate material may be used, for example deep reactive ion etching (DRIE) when substrate 201 is composed of silicon. The protective layer prevents damage to the structures formed on the membrane during the etch process. The sacrificial layer 202 and the protective layer 218 may then be removed, e.g., by etching in hydrofluoric acid (HF) or vapor phase hydrofluoric acid (VHF) as shown in FIG. 5K.

Although certain specific examples of pMUT device in accordance with aspects of the present disclosure are shown in the drawings and described hereinabove, the present disclosure is not limited to such implementations. For example, in some implementations the lower electrode layer 208 may be omitted if the membrane 204 is made of a sufficiently electrically conductive material and the device is intended to operate with the lower electrode grounded to the substrate 201. In such implementations, the membrane itself may act as the lower electrode.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶6. In particular, the use of "step of" in the claims herein is not intended to invoke the provisions of 35 USC § 112, ¶6.

What is claimed is:

1. A piezoelectric micromachined ultrasonic transducer (PMUT) device, comprising:
    a substrate having an open cavity, the substrate including anchor points around the open cavity;
    a membrane attached to the substrate at the anchor points such that a portion of the membrane overlies the open cavity; and
    an actuating structure on a surface of the membrane, the actuating structure including a piezoelectric layer sandwiched between the membrane and an upper electrode layer, wherein the actuating structure is patterned to form a central portion aligned with the open cavity and three or more rib portions projecting radially outward from the central portion to the anchor points of the substrate where a portion of each of the three or more rib portions overlaps the anchor points of the substrate, the three or more rib portions separated from one another by respective gaps in the actuating structure, the respective gaps continuously extending from the central portion to the anchor points of the substrate,
    wherein one or more of the three or more rib portions is patterned such that it is mechanically coupled to the central portion but electrically isolated from the central.

2. The device of claim 1, wherein the actuating structure is encapsulated by a passivation layer.

3. The device of claim 2, wherein the passivation layer is patterned such that it is substantially removed from portions of the membrane not covered by the actuating structure.

4. The device of claim 1, wherein the actuating structure is patterned such that portions of the actuating structure are selectively removed from portions of the membrane to form the central portion and the three or more rib portions.

5. The device of claim 1, wherein the three or more rib portions include four or more rib portions.

6. The device of claim 1, wherein the three or more rib portions include six or more rib portions.

7. The device of claim 1, wherein the three or more rib portions include eight or more rib portions.

8. The device of claim 1, wherein the three or more rib portions include one or more tapered rib portions.

9. The device of claim 1, wherein the three or more rib portions include one or more tapered rib portions that are wider proximate a perimeter of the membrane than at the central portion.

10. The device of claim 1, wherein the membrane is perforated with one or more holes that pass through the actuating structure and the membrane.

11. The device of claim 1, wherein the actuating structure includes a lower electrode layer sandwiched between the piezoelectric layer and the membrane.

12. The device of claim 1, wherein a perimeter of the open cavity is circular in shape.

13. The device of claim 1, wherein a perimeter of the open cavity is square in shape.

14. The device of claim 1, wherein a shape of the membrane is a polygonal shape.

15. The device of claim 1, further comprising an opening formed through the central portion of the actuating structure and through an underlying portion of the membrane to the open cavity.

16. A method for fabricating a piezoelectric micromachined ultrasonic transducer (PMUT) device, comprising:
    forming a membrane attached to anchor points around a substrate;
    forming an actuating structure on a surface of the membrane, the actuating structure including a piezoelectric layer sandwiched between the membrane and an upper electrode layer;
    patterning the actuating structure to form a central portion and three or more rib portions projecting radially outward from the central portion to the substrate, the three or more rib portions separated from one another by respective gaps in the actuating structure, the respective gaps continuously extending from the central portion to the anchor points of the substrate where a portion of each of the three or more rib portions overlaps the anchor points of the substrate; and
    forming an opening through a portion of the substrate to form an open cavity, such that the anchor points of the substrate are around the open cavity, a portion of the membrane overlies the open cavity and the central portion is aligned with the open cavity,
    wherein one or more of the three or more rib portions is patterned such that it is mechanically coupled to the central portion but electrically isolated from the central portion.

17. The method of claim 16, wherein the actuating structure is patterned such that portions of the actuating structure are selectively removed from portions of the membrane to form the central portion and the three or more rib portions.

18. The method of claim 16, wherein the forming of the actuating structure further comprises forming a lower electrode layer sandwiched between the piezoelectric layer and the membrane.

* * * * *